US008547780B2

(12) United States Patent
Tiltman et al.

(10) Patent No.: US 8,547,780 B2
(45) Date of Patent: Oct. 1, 2013

(54) ACOUSTIC MARKERS

(75) Inventors: Carl Peter Tiltman, Weymouth (GB); Andrew Malcolm Tulloch, Reading (GB)

(73) Assignee: Subsea Asset Location Technologies Limited, Salisbury (GB)

( * ) Notice: Subject to any disclaimer, the term of this patent is extended or adjusted under 35 U.S.C. 154(b) by 229 days.

(21) Appl. No.: 13/067,996

(22) Filed: Jul. 14, 2011

(65) Prior Publication Data

US 2011/0266089 A1 Nov. 3, 2011

Related U.S. Application Data

(63) Continuation-in-part of application No. PCT/GB2010/050058, filed on Jan. 15, 2010, and a continuation-in-part of application No. PCT/GB2010/051161, filed on Jul. 16, 2010.

(30) Foreign Application Priority Data

| | | |
|---|---|---|
| Jan. 16, 2009 | (GB) | 0900668.5 |
| Jul. 29, 2009 | (GB) | 0913203.6 |
| Jul. 31, 2009 | (GB) | 0913388.5 |
| Oct. 12, 2009 | (GB) | 0917714.8 |
| May 9, 2011 | (GB) | 1107588.4 |

(51) Int. Cl.

| | |
|---|---|
| ***H01L 41/00*** | (2013.01) |
| ***G10K 11/22*** | (2006.01) |
| ***G10K 11/162*** | (2006.01) |

(52) U.S. Cl.
USPC .................. 367/2

(58) Field of Classification Search
USPC .................. 367/2, 151, 175; 181/175
See application file for complete search history.

(56) References Cited

U.S. PATENT DOCUMENTS

| | | | | |
|---|---|---|---|---|
| 3,599,747 | A | 8/1971 | Hansen et al. | |
| 5,822,272 | A | 10/1998 | Ream | |
| 2008/0111448 | A1 | 5/2008 | Smith et al. | |
| 2011/0100745 | A1* | 5/2011 | Emery et al. | 181/175 |
| 2011/0266089 | A1* | 11/2011 | Tiltman et al. | 181/175 |
| 2012/0188844 | A1* | 7/2012 | Tiltman et al. | 367/2 |
| 2013/0105243 | A1* | 5/2013 | Tiltman et al. | 181/175 |

FOREIGN PATENT DOCUMENTS

| | | |
|---|---|---|
| DE | 28 55 207 | 8/1979 |
| GB | 2 437 016 | 5/2008 |
| WO | WO 2006/075167 | 7/2006 |
| WO | WO 2007/093002 | 8/2007 |
| WO | WO 2009/122184 | 10/2009 |

OTHER PUBLICATIONS

International Preliminary Report on Patentability and Written Opinion of the International Searching Authority dated Jul. 19, 2011 for PCT/GB2010/050058.

(Continued)

*Primary Examiner* — Daniel Pihulic
(74) *Attorney, Agent, or Firm* — Nixon & Vanderhye P.C.

(57) ABSTRACT

An acoustic reflector is described comprising a shell around a core, in which portions of the shell are capable of transmitting acoustic waves incident on the shell into the core to be focused and reflected from an area of the shell located opposite to the area of incidence of the acoustic waves to provide a reflected acoustic signal output from the reflector. Incident acoustic radiation will be differentially reflected depending on the portion of the reflector on which the incident acoustic radiation impinges.

12 Claims, 6 Drawing Sheets

(56) References Cited

OTHER PUBLICATIONS

International Search Report for PCT/GB2010/050058, mailed Jan. 24, 2011.

International Search Report for PCT/GB2010/051161, mailed Feb. 14, 2011.

* cited by examiner

ACOUSTIC MARKERS

CROSS-REFERENCES TO RELATED APPLICATIONS

This application is a Continuation-in-Part of:

(1) International Application No. PCT/GB2010/050058 filed in English on 15 Jan. 2010 claiming priority to GB Application No. 0900668.5 filed 16 Jan. 2009;

(2) International Application No. PCT/GB2010/051161 filed in English on 16 Jul. 2010 claiming priority to GB Application No. 0913203.6 filed 29 Jul. 2009, GB Application No. 0913388.5 filed 31 Jul. 2009 and GB Application No. 0917714.8 filed 12 Oct. 2009; and (3) GB Application No. 1107588.4 filed 9 May 2011.

The entire contents of these applications are incorporated herein by reference.

BACKGROUND OF THE INVENTION

1. Field of the Invention

WO2006/075167 and WO2009/122184 (both the Secretary of State for Defence and both incorporated herein by reference) describe, inter-alia, acoustic reflectors which can be used in a variety of ways to mark underwater structures, objects or geological features.

2. Discussion of Prior Art

These applications describe an acoustic reflector comprising a shell surrounding a core, said shell being capable of transmitting acoustic waves incident on the surface of the shell into the core to be focused and reflected from an area of the shell located opposite to the area of incidence so as to provide a reflected acoustic signal output from the reflector, having a core in which the shell is dimensioned relative to the core such that a portion of the acoustic waves incident on the shell wall are coupled into the shell and guided therein around the circumference of the shell and then re-radiated to combine constructively with the said reflected acoustic signal output so as to provide an enhanced reflected acoustic signal output in which the acoustic wave speed in the core is between 840 metres per second and 1500 metres per second. However, such reflectors are normally omni-directional, and can provide little information about the specific reflector concerned, its environment or the relative position of the source of acoustic waves with respect to the reflector.

SUMMARY OF THE INVENTION

According to this invention, an acoustic reflector comprises a shell around a core, portions at least of said shell being capable of transmitting acoustic waves incident on the shell into the core to be focused and reflected from an area of the shell located opposite to the area of incidence of the acoustic waves so as to provide a reflected acoustic signal output from the reflector, and in which incident acoustic radiation will be differentially reflected depending on the portion of the reflector on which the incident acoustic radiation impinges.

Preferably the acoustic reflector is in the form of an object of rotation about a central axis, so that it can be mounted and turned, or allowed to turn to provide a pulsed reflection at one or more different frequencies which are characteristic of the reflector or its environment. Suitable reflector shapes include spheres, right cylinders or tubes, right cones, or ovoids.

In one embodiment the acoustic reflector has a core material having a compressional wave speed of from 840 to 1500 $ms^{-1}$ and a shell dimensioned relative to the core such that a portion of the acoustic waves incident on portions of the shell are coupled into the shell and guided therein around the circumference of the shell and then re-radiated to combine constructively with the said reflected acoustic signal output to provide an enhanced reflected acoustic signal output.

In another embodiment the shell is dimensioned relative to the core such that a portion of the acoustic waves incident on at least one portion of the shell are coupled into the shell wall and guided therein around the circumference of the shell and then re-radiated to combine constructively with the said reflected acoustic signal output to provide an enhanced reflected acoustic signal output.

In such an embodiment best results are obtained if velocity of the wave transmission in the core to the velocity of the wave transmission in the shell is in the range of about 2.5:1 to 3.4:1, inclusive, or a multiple thereof.

In still further embodiment an acoustic reflector comprises a shell surrounding a core, said shell being capable of transmitting acoustic waves incident on the surface of the shell into the core to be focused and reflected from an area of the shell located opposite to the area of incidence so as to provide a reflected acoustic signal output from the reflector, having a core in which the shell is dimensioned relative to the core such that a portion of the acoustic waves incident on the shell wall are coupled into the shell and guided therein around the circumference of the shell and then re-radiated to combine constructively with the said reflected acoustic signal output so as to provide an enhanced reflected acoustic signal output in which the ratio of the speed of the wave transmission in the core to the speed of the wave transmission in the shell is in the range of about 3:1 and 3.2:1, inclusive, or a multiple harmonic thereof.

The core of the acoustic reflector may be formed of one or more concentric layers of a solid material. In another embodiment the core has parallel layers of materials having different compressional wave speeds.

In a further embodiment part of the surface of the shell is covered by an acoustic absorbing material that will absorb incident acoustic at frequencies at which the reflector would otherwise be reflective.

If the acoustic reflector is a right cylinder, the acoustic absorbing material can be arranged in parallel strips on the surface of the cylinder parallel to the central axis of the cylinder. Rotation to the cylinder will provide a reflected acoustic wave characteristic of the width and separation of the strips and the speed of rotation.

If the acoustic reflector is a sphere, the acoustic absorbing material is arranged in segments on its surface.

The core can be formed from one or more elastomer materials, by having different elastomer materials in different layers of a core, the physical behaviour of the core in different areas will differ for different acoustic frequencies. Thus parts of the core can respond to and transport an acoustic wave at one frequency that will combine constructively with a portion of the same wave that has been transmitted around the shell, but other parts will transport the wave in a way that will recombine destructively at the same frequency with the portion that has been transmitted around the shell wall, and thus little or no reflection is obtained. It can be seen that by varying frequency of the acoustic signal and the direction between the source of the acoustic wave and the reflector, the reflected signal, and the frequency at which a reflected signal is obtained can provide information about the spatial relationship between the source of the signal and the reflector.

Suitable materials for the core can include silicone rubbers such as an RTV12 or RTV655 silicone rubbers. In this case the shell is may be formed from a rigid material. Steel is possible as is glass reinforced plastics (GRP) or glass filled polyamide or glass filled nylon. The core material may, alternatively, be metal with a metallic shell provided that the ratio of the speed of the wave transmission in the core to the speed of the wave transmission in the shell is in the range of about 2.5:1 to 3.4:1, inclusive, or a multiple thereof.

In one embodiment of the invention an acoustic reflector is shaped in such a way that incoming acoustic waves impinging on parts of the surface will be scattered and not reflected. A right cone an example of such a shape, acoustic waves directed at the point will be scattered, simply acoustic waves directed at the base will be scattered, the same will occur on the inclined sides of the cone nearest the point and base, however incoming acoustic waves impinging on the middle portion of the inclined sides will be reflected. An ovoid shape will work in a similar way.

Devices of this invention can be used as markers to indicate specific directions to approach underwater objects, to help in final navigation towards an object or to provide directional information. As an example an underwater valve may be marked with a reflector of this invention. The pipeline to which the valve is connected may be marked more generally with omni-directional reflectors to indicate to a submersible its position. The directional reflector attached to the valve can be used by the submersible to indicate the correct direction from which to approach the valve safely.

Another application of the devices of this invention would be to provide an underwater "lighthouse". If a reflector capable of reflecting acoustic signals in one or more specific directions is rotatably mounted and powered or fitted with a fin to cause it to rotate in a marine current, it will reflect a pulsing signal when interrogated acoustically. The rate of rotation or the position of the absorbent materials will give the reflected acoustic signals a particular pulsed characteristic by which the reflector concerned can be identified. As in a "lighthouse" the characteristic can be used to give location information.

Another application of this invention would be to mark the sites of underwater channels or passages between fixed objects, say, wrecks or underwater cliff. The characteristics of the reflectors on one side of the channel can be different from those on the other side to act in a similar way as red and green lights on buoys marking sea channels.

BRIEF DESCRIPTION OF THE DRAWINGS

The invention will now be described with reference to the accompanying drawings in which.

DETAILED DISCUSSION OF EMBODIMENTS

Figure 1:
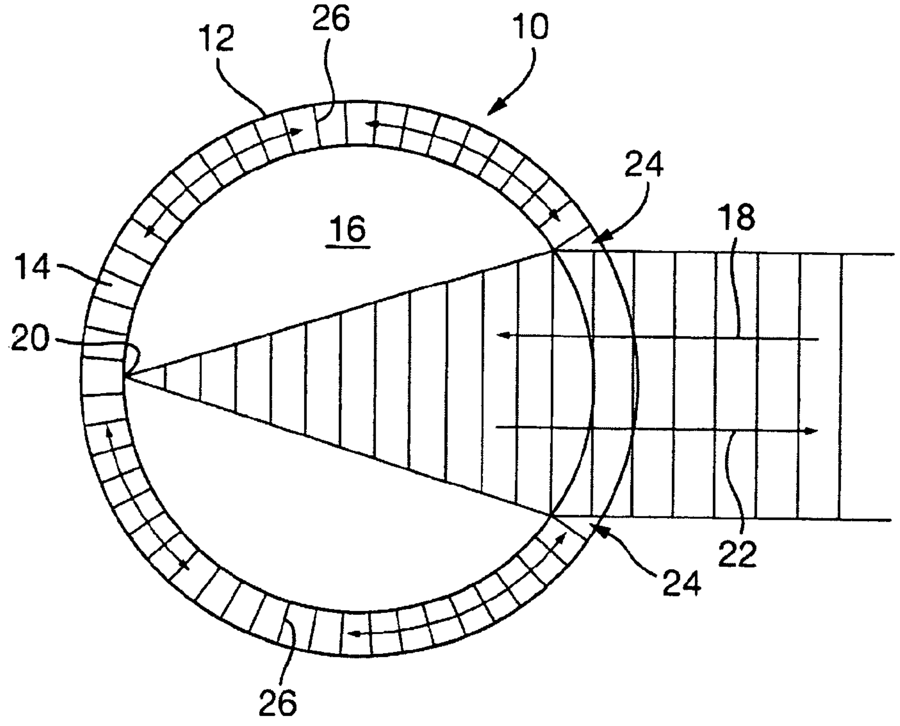
FIG. 1 illustrates the principles of an acoustic reflector of a kind used in the present invention.

In FIG. 1, an acoustic reflector 10 comprises a spherical shell 12. The shell 12 surrounds a core 16.

The shell 12 is formed from a rigid material such as a glass reinforced plastics (GRP) material or steel. The core 16 is formed from a solid material such as an elastomer. The frequency, or range of frequencies, at which the acoustic reflector is applicable is dependent on predetermined combinations of materials, used to form the shell and core, and the relative dimensions thereof.

However, as will be appreciated by the reader, other combinations of materials may be used provided the shell and core are dimensioned relative to each other in accordance with the wave propagating properties of the materials used.

Incident acoustic waves 18, transmitted from an acoustic source (not shown), are incident on the shell 12. Where the angle of incidence is high most of the acoustic waves 18 are transmitted through the shell wall 14, into the core 16. As the acoustic waves 18 travel through the core 16 they are refracted and thereby focused onto an opposing side 20 of the shell, from which the acoustic waves 18 are reflected back, along the same path, as a reflected acoustic signal output 22. However, where the angle of incidence is smaller, at a coupling region 24 of the shell, i.e. at a sufficiently shallow angle relative to the shell, a portion of the incident waves 18 is coupled into the wall 14 to provide shell waves 26 which are guided within the wall 14 around the circumference of the shell 12.

The materials which form the shell 12 and the core 16 and the relative dimensions of the shell and core are predetermined such that the transit time of the shell wave 26 is the same as the transit time of the internal geometrically focused returning wave (i.e. the reflected acoustic signal output 22). Therefore, the contributions of the shell wave, which is reradiated, and the reflected acoustic signal output are in phase with each other and therefore combine constructively at a frequency of interest to provide an enhanced reflected acoustic signal output (i.e. high target strength). That is to say, for a spherical acoustic reflector the circumference of the shell is the path length and therefore must be dimensioned in accordance with the respective transmission speed properties of the shell and the core, such that resonant standing waves are formed in the shell which are in phase with the reflected acoustic signal output to combine constructively therewith.

Preferably, the core is formed from a single solid material having a wave speed between 840 $ms^{-1}$ and 1300 $ms^{-1}$. Alternatively, the core may comprise two or more layers of different materials where, for a particular selected frequency of the acoustic waves, these would provide either more effective focussing of the incoming waves and/or lower attenuation within the material so as to result, overall, in a stronger output signal. Naturally, however, the complexity and costs of manufacture in the case of a layered core would be expected to be greater. Where the core is formed of two or more layers of different materials, either or both of the materials may have a wave speed of up to 1500 $ms^{-1}$.

To be suitable for use in the reflector device of the invention, the core material must be such that it exhibits a wave speed in the required range without suffering from a high absorption of acoustic energy. The core may be formed from an elastomer material such as, for example, a silicone, particularly RTV12 or RTV655 silicone rubbers from Bayer or Alsil 14401 peroxide-cured silicone rubbers.

The shell may be formed of a rigid material, such as, for example, a glass reinforced plastics (GRP) material, particularly a glass filled nylon such as 50% glass filled Nylon 66, “Zytel” ®-33% glass reinforced nylon, or 40% glass filled semi-aromatic polyamide, or steel and may be dimensioned such that its thickness is approximately one-tenth of the radius of the core. However, the derivation of the appropriate relationship between these parameters in relation to the characteristics of the materials used for the core and shell will be readily understood by the skilled person.

It will be appreciated by the reader that different combinations of solid core and rigid shell materials may be used provided they are dimensioned to provide shell waves which are in phase with the reflected acoustic signal output such that they combine constructively therewith.

Figure 2:
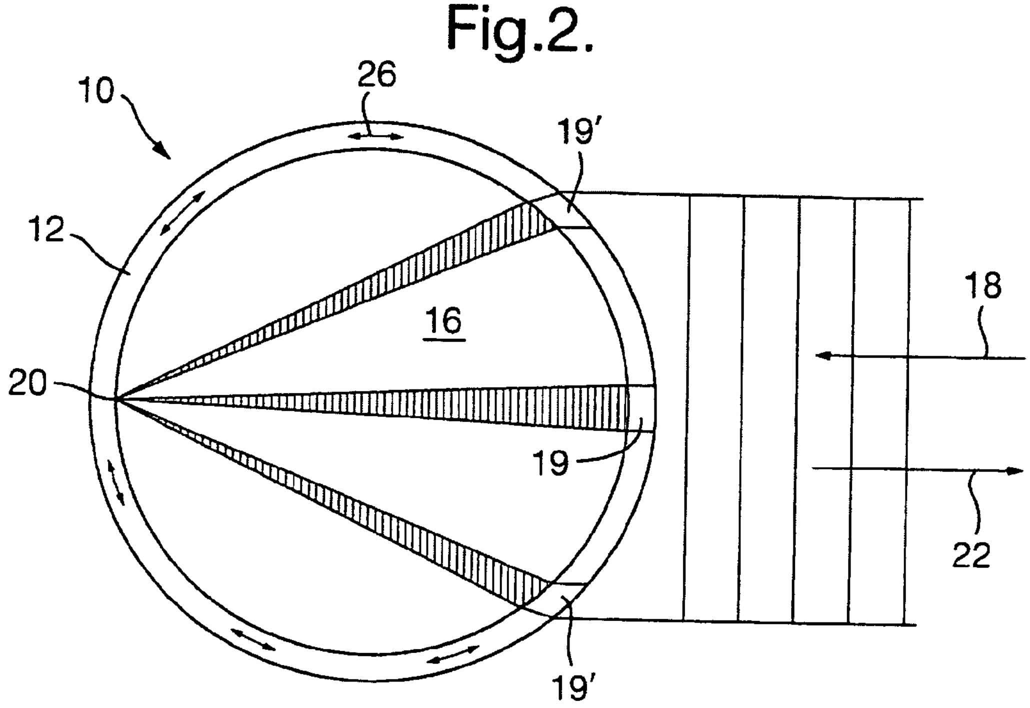
FIG. 2 is a schematic representation of a cross section through a development of an acoustic reflector of a kind used in this invention showing some acoustic paths through the reflector core.

Referring to FIG. 2, which shows a further development of the reflector of FIG. 1, an acoustic reflector 10 comprises a spherical shell 12. The shell 12 surrounds a core 16. The shell 12 is formed from a rigid material such as a glass reinforced plastics (GRP) material or steel. The core 16 is formed from a solid material such as an elastomer.

Acoustic waves 18, transmitted from an acoustic source (not shown), are incident as shown on the shell 12. The properties of the shell are selected in the manner previously described such that it exhibits two regions disposed around lines of latitude of the shell which act as transmission “windows”, i.e. such that the incident acoustic waves are in these regions efficiently transmitted through the shell 12 and into the core 16. Consequently the incident acoustic waves then follow two paths (19, 19') as they travel through the core 16 and are refracted and thereby focused onto an area 20 of the opposing side of the shell from the side on which the acoustic waves 18 are incident. The waves are then reflected back, along the same respective paths and combine together to provide an enhanced reflected acoustic signal output 22 of the reflector.

For regions of the shell where the angle of incidence of the incoming acoustic wave is low, a portion of the incident waves 18 is coupled into the shell 12 and generates elastic waves 26 which are guided within the shell 12 around the circumference of the shell 12. Where the materials which form the shell 12 and the core 16 and the relative dimensions of the shell and core are predetermined such that the transit time of the shell wave 26 is the same as the transit time of the internal geometrically focused returning waves (19, 19'), the elastic wave travelling through the shell wall and the reflected acoustic signal output are in phase with each other and therefore combine constructively at a frequency of interest to provide a further enhanced reflected acoustic signal output 22 (i.e. a strong target response).

Figure 3:
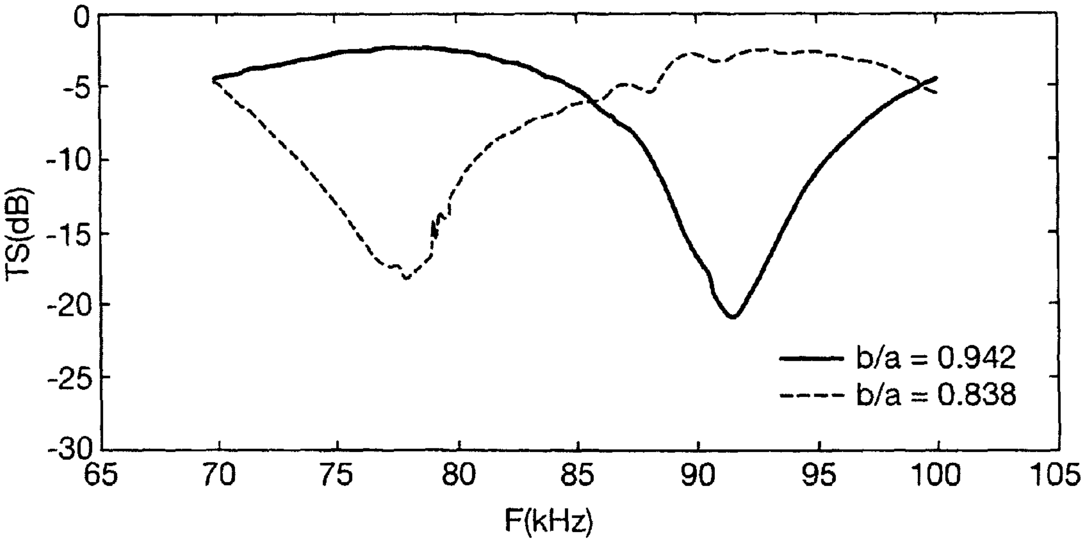
FIG. 3 is a graph of target strength against frequency for two different reflectors of the kind shown in FIG. 2 showing the effect of different thicknesses of shell wall on the frequency response.

FIG. 3 shows the spectral response for two different reflectors having the same core and shell properties as for the reflector of FIG. 2 and an external radius of 210 mm but where the ratio of internal to external radii have different values (0.942 (heavy line) and 0.838 (light line) respectively, corresponding to shell thicknesses of 12 mm and 34 mm). As can be seen from FIG. 3, reflectors having different shell thickness results in reflectors have quite markedly different spectral responses. Further variation may be obtained by changing the material properties of the inner core and/or the outer shell of the reflector.

Figure 4:
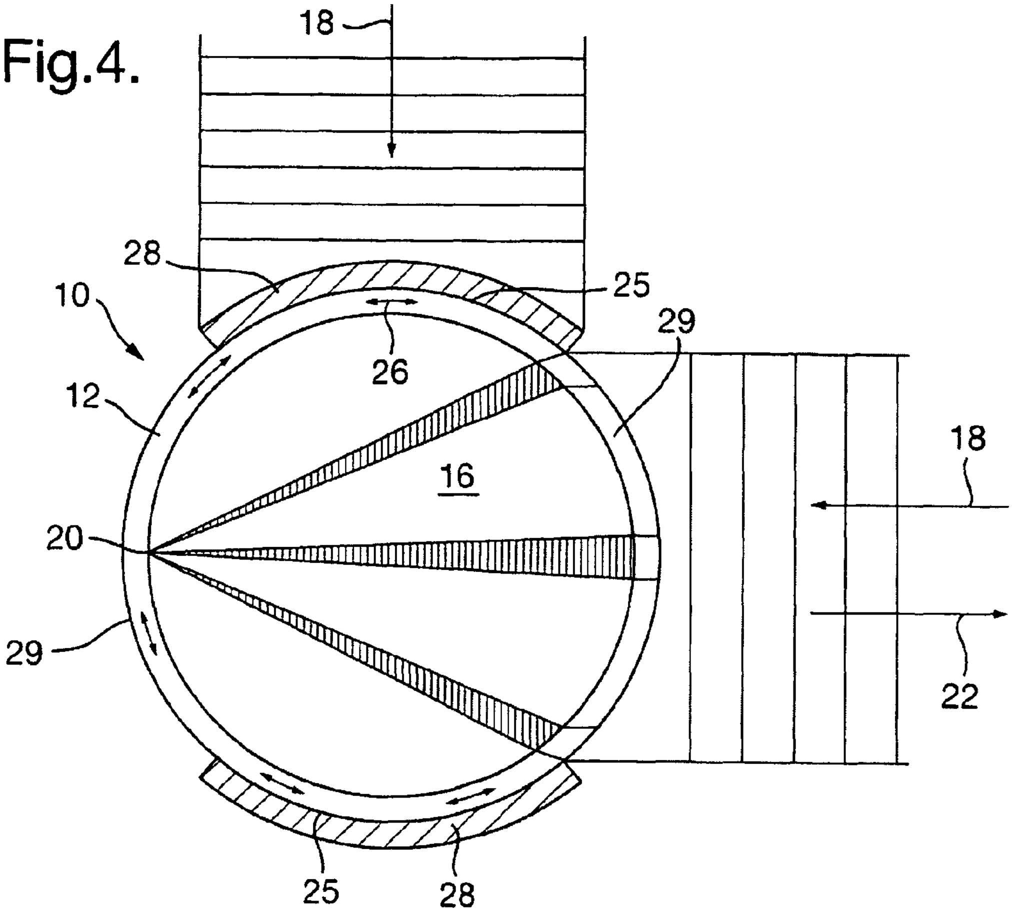
FIG. 4 shows a spherical reflector according to the invention with a reflection exclusion zone.

In FIG. 4 an acoustic reflector 10 of the find shown in FIG. 2 comprises the sphere having a shell 12 and core 16 made of elastomer materials as described in FIG. 2. Portions 25 of the outside of the shell skin are coated with an acoustic absorbing material 28. The material can be any one of a number of acoustic absorbing materials ranging from polystyrene foam, syntactic foam and rubber to more sophisticated materials such as used to coat submarines. Between the segments of acoustic absorbing material 28 slots or windows 29 are defined in the shell through which incoming acoustic signals 18 will be transmitted to the core 16 and around the shell itself as described with reference to FIGS. 1 and 2. Between the windows 29 the acoustic absorbing material 28, making the portions 25 essentially deaf to incoming acoustic signals, and no reflection of signals directed at the portions 25 will occur.

Figure 5:
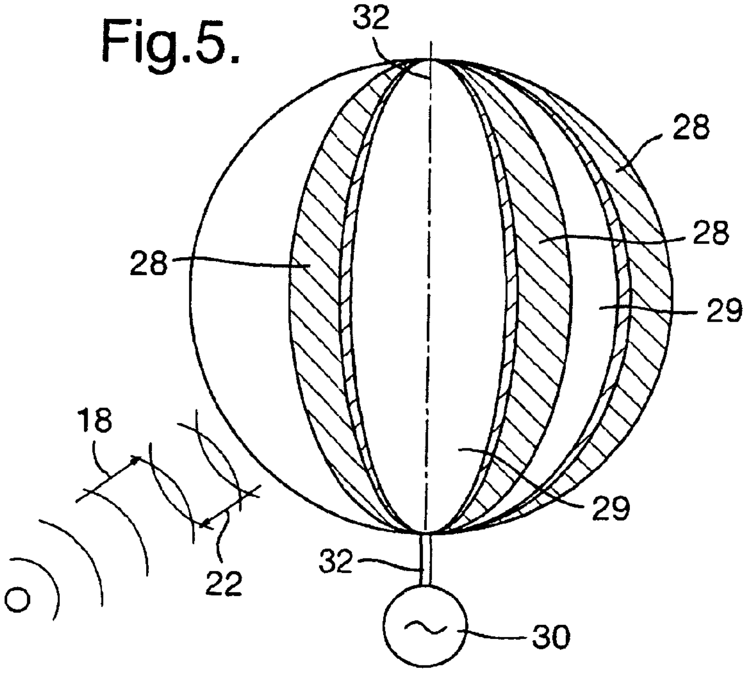
FIGS. 5 and 6 show similar spherical reflectors mounted to rotate and to provide pulses of reflected acoustic signals when interrogated by a narrow beam acoustic source.

In FIG. 5, the device of FIG. 4 has the acoustic reflecting materials arranged as regular segments 28 on the surface of the reflector and is rotated using a motor 30 connected to its central axis 32. The segments 28 are about the central axis 32. In this instance, if a narrow beam acoustic wave 18 impinges on the reflector the rotation will cause an intermittent or “flashing” acoustic reflected wave 22 is obtained from the reflector 10. The size of the slots or windows 29 and the speed of rotation of the reflector 10 and the repeat frequency of the sonar characterise the nature of the emitted acoustic wave 22 (in the same way as flashing lights on lighthouses). Obviously if the rate of rotation and the repeat frequency of the sonar are synchronised, nothing will be reflected. The rate of flashing can be used to identify the particular reflector concerned.

Figure 6:
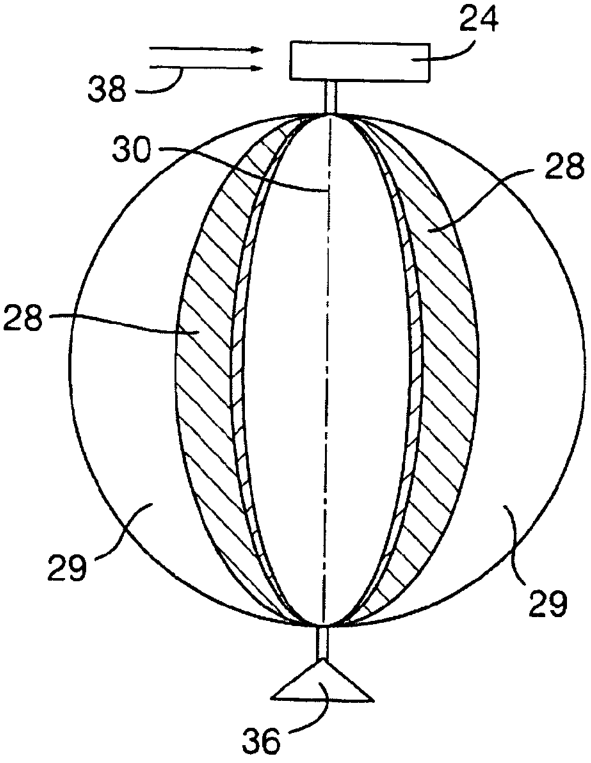

FIG. 6 shows a similar arrangement that figure of FIG. 5, but in this instance the reflector is rotatably mounted on a pivot 36. A fin 34 mounted on the central axis, but opposite the pivot 36 is acted on by underwater currents 38 to turn the reflector. This device can be used for direction finding, but variations in current speed may make accurate identification of the reflector concerned less reliable. Instead such a device could be used to provide information about current speeds, particularly when these are critical to underwater activities or safety.

Figure 7:
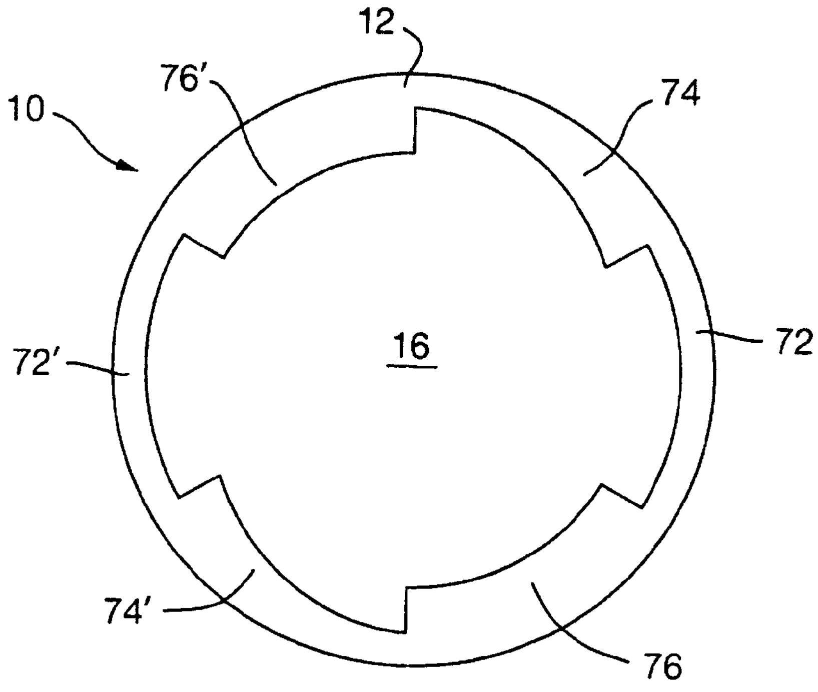
FIG. 7 shows another spherical reflector according to the invention.

In FIG. 7 a similar output to the device of FIG. 4 obtained by constructing the reflector 10 with a shell 12 constructed of varying thicknesses. In this instance the shell 12 has areas of three different thicknesses 34, 36 and 38, these areas being disposed around the inside of the shell in opposing pairs (74 and 74', 76 and 76', and 78 and 78'). This results in differing spectral behaviour depending on which part of the shell the incoming acoustic wave impinges (see FIG. 3). For example the area 74 may form a deaf portion to certain frequencies whereas for other frequencies it will be a window, and similarly of the other areas. It can be seen therefore that is possible to construct a reflector where different portions of the shell present reflections at frequencies. By interrogating the reflector with a wide bandwidth acoustic waveform, the reflected acoustic will be characteristic of the area of the shell that the acoustic wave impinged. Alternatively, by knowing the response frequencies of the three areas of such a reflector, and integrating with a narrow bandwidth signal, the presence of a response or not will be indicative of the relative position and orientation of the reflector to the source of the acoustic signal. Using a narrow steerable acoustic beam, the angle to which it is necessary to steer the beam to get a response will provide considerable relative position information.

Figure 8:
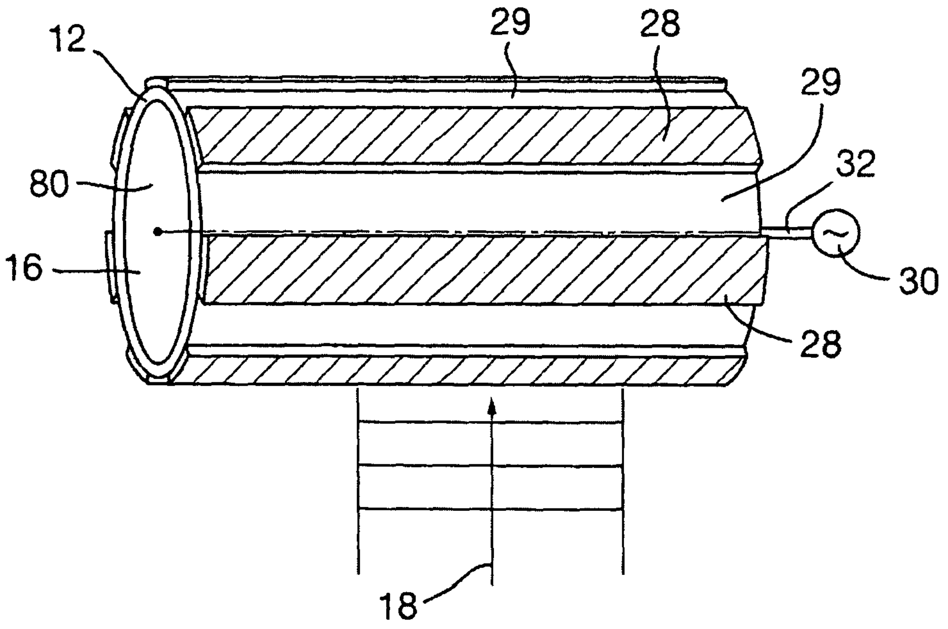
FIG. 8 shows a cylindrical reflector according to the invention.

In FIG. 8 the acoustic reflector 10 comprises a right cylinder 80. The cylinder is mounted on its central axis 32 to motor 30. The cylinder itself comprises a cylindrical shell 12 and core 16. The outer surface of the shell 12 has a series of parallel longitudinal strips of acoustic absorbing material 28 thereon each strip also parallel to the central axis. This material would be of the same kind that might be used in the example of FIG. 4. Between the strips of acoustic absorbing material 28, slots or windows 29 occur in the shell 12 through which incident acoustic waves may be reflected.

Figure 9:
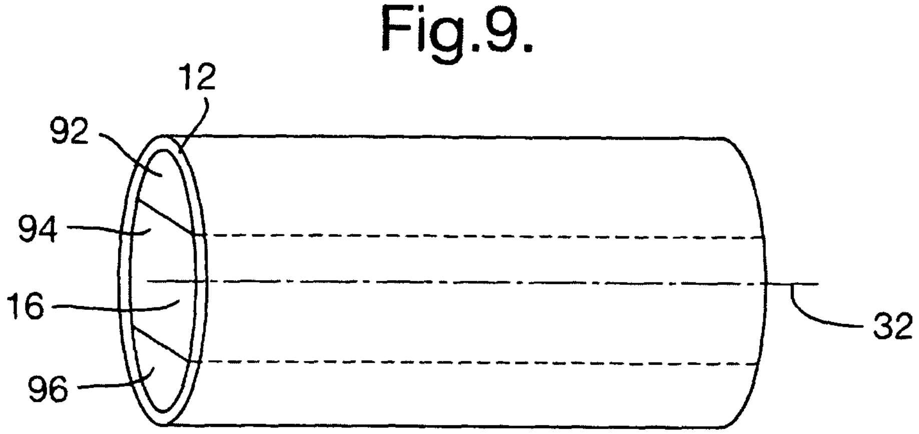
FIG. 9 shows a further cylindrical reflector according to the invention designed to reflect acoustic signals at different frequencies according to the part of the surface on which the acoustic signal impinges.

In FIG. 9, an acoustic reflector 10 comprises a right cylinder 80 with a shell 12. In this case the core 16 comprises layers 92, 94, and 96 of elastomer material. The elastomer material in the layers is of different densities. The layer 94 extends across the axis of the cylinder will transmit certain acoustic frequencies but not others. It will be seen that an incoming acoustic wave impinging on areas the shell 12 adjoining the layer 94, if at the frequencies to which layer 94 responds will be reflected by the cylinder as previously described. However, acoustic wave at other frequencies will not be reflected. Likewise acoustic waves impinging on the areas of the shell outside layers 92 and 96 may be reflected or not depending on the response of these layers to the frequency concerned and on whether the acoustic wave can cross the middle band 94. It can be seen that by varying the densities of the elastomers within the core 16 from one reflector to another, highly characteristic responses can be obtained. Such reflectors again can provide guidance information, by arranging for relatively weak reflections from the areas of the shell outside layers 92 and 96, but a very strong reflection from the areas of the shell around the layer 94. This can be useful particularly for underwater navigation and direction finding, giving an indication of whether the acoustic source is in a desired alignment or not with the reflector. If three different kinds of reflection are caused, depending on the area of the shell interrogated, in effect an acoustic system akin to optical landing lights can be obtained.

Figure 10A:
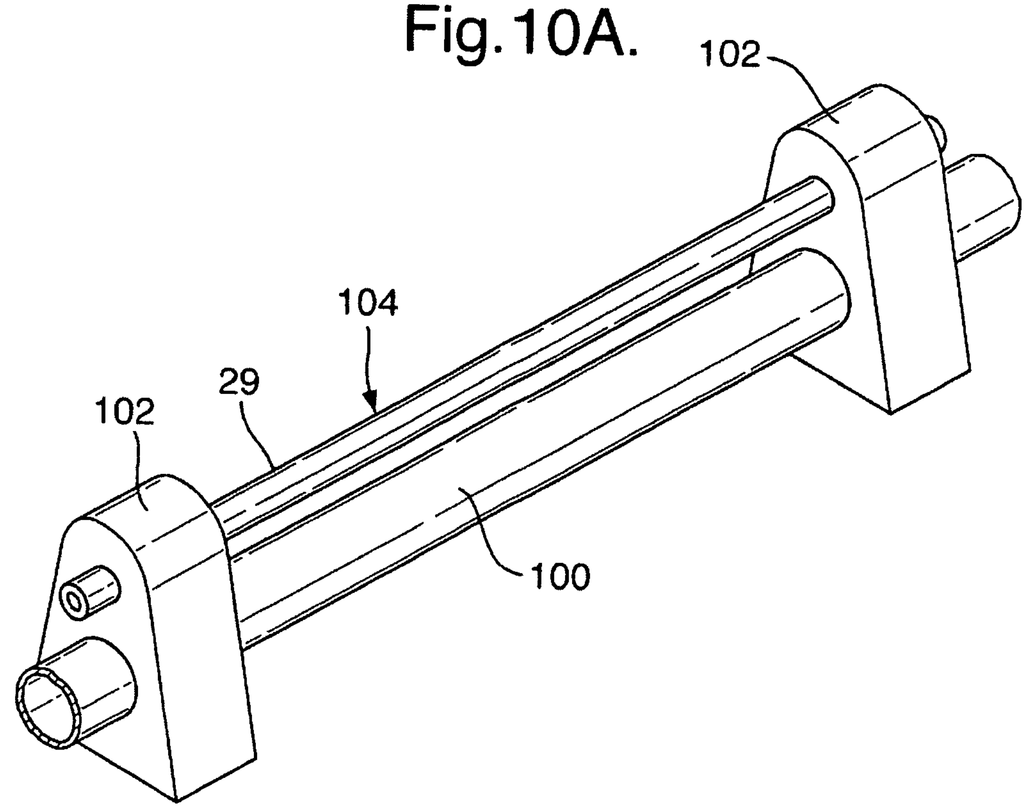
FIGS. 10A and 10B shows the application of a cylindrical reflector according to the invention to marking a pipeline.
Figure 10B:
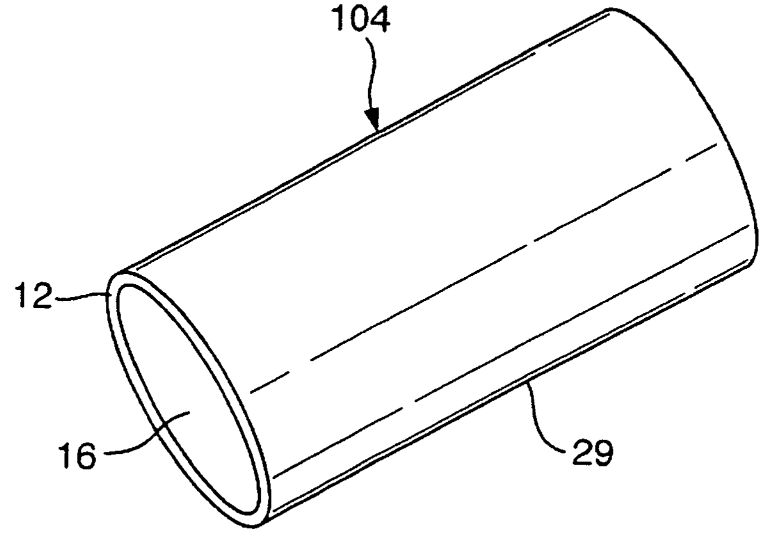

In FIG. 10A an elongate cylindrical or tubular reflector 104 is shown attached to a pipeline 100 by supports 102. The cylindrical reflector (shown in more detail in FIG. 10B) comprises an open ended cylindrical shell 16, in this example, Zytel®, and filled with the elastomer RTV12 for the core 12. Acoustic waves directed perpendicularly to the axis of the cylinder at the outside 29 of the cylindrical portion of the shell 12 will in part be transmitted through the sell into the core to be reflected from the opposite side of the shell, in part the acoustic waves will be transmitted around the shell within the shell wall and combine constructively with the waves transmitted and reflected through the core 16 and reradiated from the shell towards the source of the original acoustic waves. If acoustic waves are directed towards the ends or edges the shell or the exposed core in the open ends of the cylinder will simply be scattered or absorbed by the core 16. Likewise no strong return signal will be obtained from the supports 102.

In all the examples given, advantage may be taken of more recent developments described in UK Patent Applications GB Patent Applications 0913203.6, 0913388.5 and 0917714.8 published in WO2011/012877 by the present inventors to use a metal core and metal shell or other combinations of materials enabling the reflectors to operate at greater depths than is possible with the reflectors of WO 2006/075167 and WO2009/122184.

The invention claimed is:

1. An acoustic reflector comprising:

a shell around a core, a portion at least of said shell being capable of transmitting acoustic waves incident on the shell into the core to be focused and reflected from an area of the shell located opposite to the area of incidence of the acoustic waves so as to provide a reflected acoustic signal output from the reflector, and in which incident acoustic radiation will be reflected deferentially depending on the portion of the reflector on which the incident acoustic radiation impinges;

the reflector being in the form of an object of rotation about a central axis selected from the group comprising a right cylinder or tube, a right cone, an ovoid or a sphere; in the case of a sphere the shell having portions covered with an acoustic absorbing material or is of a variable thickness.

2. An acoustic reflector according to claim 1 in the form of a right cylinder or tube, a right cone, an ovoid having a core comprising elastomeric material in which the shell is dimensioned relative to the core such that part of the acoustic waves incident on portions of the shell are coupled into the shell and guided therein around the circumference of the shell and then re-radiated to combine constructively with the said reflected acoustic signal output to provide an enhanced reflected acoustic signal output.

3. An acoustic reflector according to claim 1 comprising elastomeric material in which the shell is dimensioned relative to the core such that part of the acoustic waves incident on portions of the shell are coupled into the shell and guided therein around the circumference of the shell and then reradiated to combine constructively with the said reflected acoustic signal output to provide an enhanced reflected acoustic signal output in which the ratio of the speed of acoustic wave transmission in the shell to that of the speed of acoustic wave transmission in the core is in the range of 2.5:1 to 3.4:1 inclusive or a multiple thereof.

4. An acoustic reflector according to claim 3 in which the ratio of the speed of acoustic wave transmission in the shell to that of the speed of acoustic wave transmission in the core is in the range of about 3:1 and 3.2:1, inclusive, or a multiple thereof.

5. An acoustic reflector according to claim 1 in which portions of the surface of the shell are covered by an acoustic absorbing material which absorb incident acoustic at frequencies at which the reflector would otherwise be reflective.

6. An acoustic reflector according to claim 5 characterised in that the acoustic absorbing material is a syntactic foam.

7. An acoustic reflector according to claim 5 comprising a right cylinder or tube in which acoustic absorbing material is arranged in parallel strips on the surface of the cylinder the strips being parallel to the central axis of the cylinder.

8. An acoustic reflector according to claim 1 in which the reflector is rotatably mounted on a central axis.

9. An acoustic reflector according to claim 8 in which the acoustic reflector is provided with a motor to turn the reflector about the said axis.

10. An acoustic reflector according to claim 8 in which acoustic reflector is provided with a fin.

11. An acoustic reflector according to claim 1 comprising a right cylinder or tube mounted adjacent to a pipe as an acoustic marker for the pipe.

12. An acoustic reflector according to claim 11 in which portions of the surface of the shell are masked by material which does not reflect incident acoustic at frequencies at which the reflector would otherwise be reflective.

* * * * *